US012772770B2

(12) United States Patent
Peng

(10) Patent No.: US 12,772,770 B2
(45) Date of Patent: Oct. 20, 2026

(54) MANUFACTURING METHOD OF SEMICONDUCTOR STRUCTURE

(71) Applicant: NANYA TECHNOLOGY CORPORATION, New Taipei City (TW)

(72) Inventor: Jung Tzu Peng, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 211 days.

(21) Appl. No.: 18/929,662

(22) Filed: Oct. 29, 2024

(65) Prior Publication Data

US 2026/0123315 A1 Apr. 30, 2026

(51) Int. Cl.

| | |
|---|---|
| ***H10P 50/00*** | (2026.01) |
| ***H10P 76/20*** | (2026.01) |
| ***H10P 76/40*** | (2026.01) |

(52) U.S. Cl.
CPC .............. *H10P 50/73* (2026.01); *H10P 50/71* (2026.01); *H10P 76/2041* (2026.01); *H10P 76/4085* (2026.01)

(58) Field of Classification Search
None
See application file for complete search history.

(56) References Cited

U.S. PATENT DOCUMENTS

| | | | | |
|---|---|---|---|---|
| 7,601,647 | B2 * | 10/2009 | Jeon | H10P 50/268 257/E21.038 |
| 10,395,976 | B1 * | 8/2019 | Shih | H10P 50/28 |
| 2024/0177995 | A1 | 5/2024 | Lung et al. | |
| 2024/0258174 | A1 | 8/2024 | Tsai et al. | |

FOREIGN PATENT DOCUMENTS

| | | |
|---|---|---|
| TW | 202439923 | 10/2024 |
| TW | 202441636 | 10/2024 |

OTHER PUBLICATIONS

"Office Action of Taiwan Counterpart Application", issued on Jul. 18, 2025, p. 1-p. 3.

* cited by examiner

*Primary Examiner* — Roberts P Culbert
(74) *Attorney, Agent, or Firm* — JCIPRNET

(57) ABSTRACT

A manufacturing method of a semiconductor structure is provided. The method includes the following steps. A target layer and a hardmask layer are sequentially formed on a substrate. A part of the hardmask layer is removed to form a recess. A plurality of first patterns are formed on a top surface of the hardmask layer and a plurality of second patterns are formed in the recess simultaneously. A pattern density of the plurality of first patterns is smaller than that of the plurality of second patterns. The hardmask layer and the target layer are patterned using the first patterns and the second patterns as a mask to form a plurality of first target patterns corresponding to the plurality of first patterns and a plurality of second target patterns corresponding to the plurality of second patterns in the target layer. The first and second patterns and the hardmask layer are removed.

10 Claims, 8 Drawing Sheets

MANUFACTURING METHOD OF SEMICONDUCTOR STRUCTURE

BACKGROUND

Technical Field

The present invention relates to a semiconductor process, and in particular to a manufacturing method of a semiconductor structure including first target patterns with a smaller pattern density and second target patterns with a larger pattern density.

Description of Related Art

In the semiconductor process, a patterning process is used to transfer a target pattern into a target layer on a substrate. The patterning process may include forming a patterned mask layer with a pattern corresponding to the target pattern on the target layer, performing an anisotropic etching process on the target layer using the patterned mask layer as an etching mask, and removing the patterned mask layer.

For a target pattern including first target patterns with a smaller pattern density and second target patterns with a larger pattern density, during the anisotropic etching process, an etching rate in a first region where the first target patterns are formed may be greater than an etch rate in a second region where the second target patterns are formed. As a result, after the target pattern is formed in the target layer, the over-etching may be occurred in the first region, causing damage to the substrate or causing the first target patterns to collapse or break. On the other hand, in order to avoid the over-etching in the first region, the etching time is reduced, and thus the second target patterns cannot be formed in the second region due to under-etching.

SUMMARY

The present invention provides a manufacturing method of a semiconductor structure including first target patterns with a smaller pattern density and second target patterns with a larger pattern density, in which two patterning process are performed on a hardmask layer formed on a target layer.

The manufacturing method of the semiconductor structure of the present invention includes the following steps. A target layer is formed on a substrate. A hardmask layer is formed on the target layer. A part of the hardmask layer is removed to form a recess in the hardmask layer. A plurality of first patterns are formed on a top surface of the hardmask layer and a plurality of second patterns are formed in the recess simultaneously, wherein a pattern density of the plurality of first patterns is smaller than a pattern density of the plurality of second patterns. The hardmask layer and the target layer are patterned using the plurality of first patterns and the plurality of second patterns as a mask to form a plurality of first target patterns corresponding to the plurality of first patterns and a plurality of second target patterns corresponding to the plurality of second patterns in the target layer. The plurality of first patterns, the plurality of second patterns and the hardmask layer are removed.

In an embodiment of the manufacturing method of the semiconductor structure of the present invention, a width between a boundary of the recess and an outmost second pattern of the plurality of second patterns is 0.1 μm to 5 μm.

In an embodiment of the manufacturing method of the semiconductor structure of the present invention, a method for forming the recess includes the following steps. A first photomask having an opening is provided, wherein the opening corresponds to a position of the recess. A first photoresist layer is formed on the hardmask layer. A first exposure and development process is performed on the first photoresist layer using the first photomask to form a patterned photoresist layer. An anisotropic etching process is performed on the hardmask layer using the patterned photoresist layer as an etching mask. The patterned photoresist layer is removed.

In an embodiment of the manufacturing method of the semiconductor structure of the present invention, a thickness of the first photoresist layer is 50 nm to 200 nm.

In an embodiment of the manufacturing method of the semiconductor structure of the present invention, the plurality of first patterns and the plurality of second patterns are photoresist patterns.

In an embodiment of the manufacturing method of the semiconductor structure of the present invention, a method for forming the plurality of first patterns and the plurality of second patterns includes the following steps. A second photomask including a first region and a second region is provided, wherein a plurality of first photomask patterns corresponding to the plurality of first patterns are located in the first region, and a plurality of second photomask patterns corresponding to the plurality of second patterns are located in the second region. A second photoresist layer is formed on the hardmask layer. A second exposure and development process is performed on the second photoresist layer using the second photomask.

In an embodiment of the manufacturing method of the semiconductor structure of the present invention, a wavelength for exposing the first photoresist layer is greater than a wavelength for exposing the second photoresist layer.

In an embodiment of the manufacturing method of the semiconductor structure of the present invention, the first pattern includes a hole pattern or a line pattern.

In an embodiment of the manufacturing method of the semiconductor structure of the present invention, the second pattern includes a hole pattern or a line pattern.

In an embodiment of the manufacturing method of the semiconductor structure of the present invention, a top surface of the first target pattern and a top surface of the second target pattern are coplanar.

Based on the above, in the manufacturing method of the semiconductor structure of the present invention, since the recess in the hardmask layer is formed in advance corresponding to the region where the target patterns with a larger pattern density are formed in the target layer, the thickness of the portion of the hardmask layer corresponding to the region is thinner. In this way, even though the etching rate on the portion of the hardmask layer on which the photoresist patterns with a larger pattern density are formed is slower, the hardmask layer and the target layer may be patterned without over-etching on the substrate or under-etching on the target layer.

DESCRIPTION OF THE EMBODIMENTS

Figure 1A:
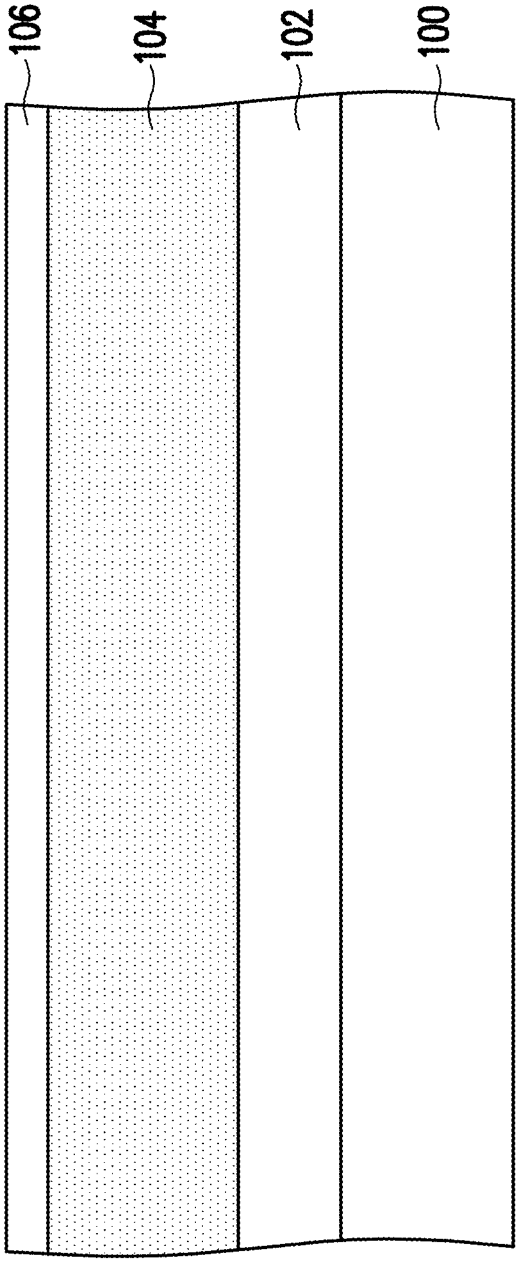
FIGS. 1A to 1F are schematic cross-sectional views of the manufacturing method of the semiconductor structure of the embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Also, herein, a range expressed by "one value to another value" is a general representation to avoid enumerating all values in the range in the specification. Thus, the recitation of a particular numerical range encompasses any numerical value within that numerical range, as well as smaller numerical ranges bounded by any numerical value within that numerical range.

FIGS. 1A to 1F are schematic cross-sectional views of the manufacturing method of the semiconductor structure of the embodiment of the present invention.

Referring to FIG. 1A, a substrate 100 is provided. In the present embodiment, the substrate 100 may be a silicon substrate, a dielectric layer on the silicon substrate or a conductive layer on the silicon substrate. Next, a target layer 102 to be patterned may be formed on the substrate 100. In the present embodiment, the target layer 102 may be a dielectric layer or a conductive layer. In subsequent processes, the target layer 102 may be patterned to include a plurality of first target patterns with a smaller pattern density and a plurality of second target patterns with a larger pattern density. Thern, a hardmask layer 104 is formed on the target layer 102. A material of the hardmask layer 104 is different from a material of the target layer 102. After forming the hardmask layer 104, a first photoresist layer 106 is formed on the hardmask layer 104 for the subsequent exposure and development process.

Figure 1B:
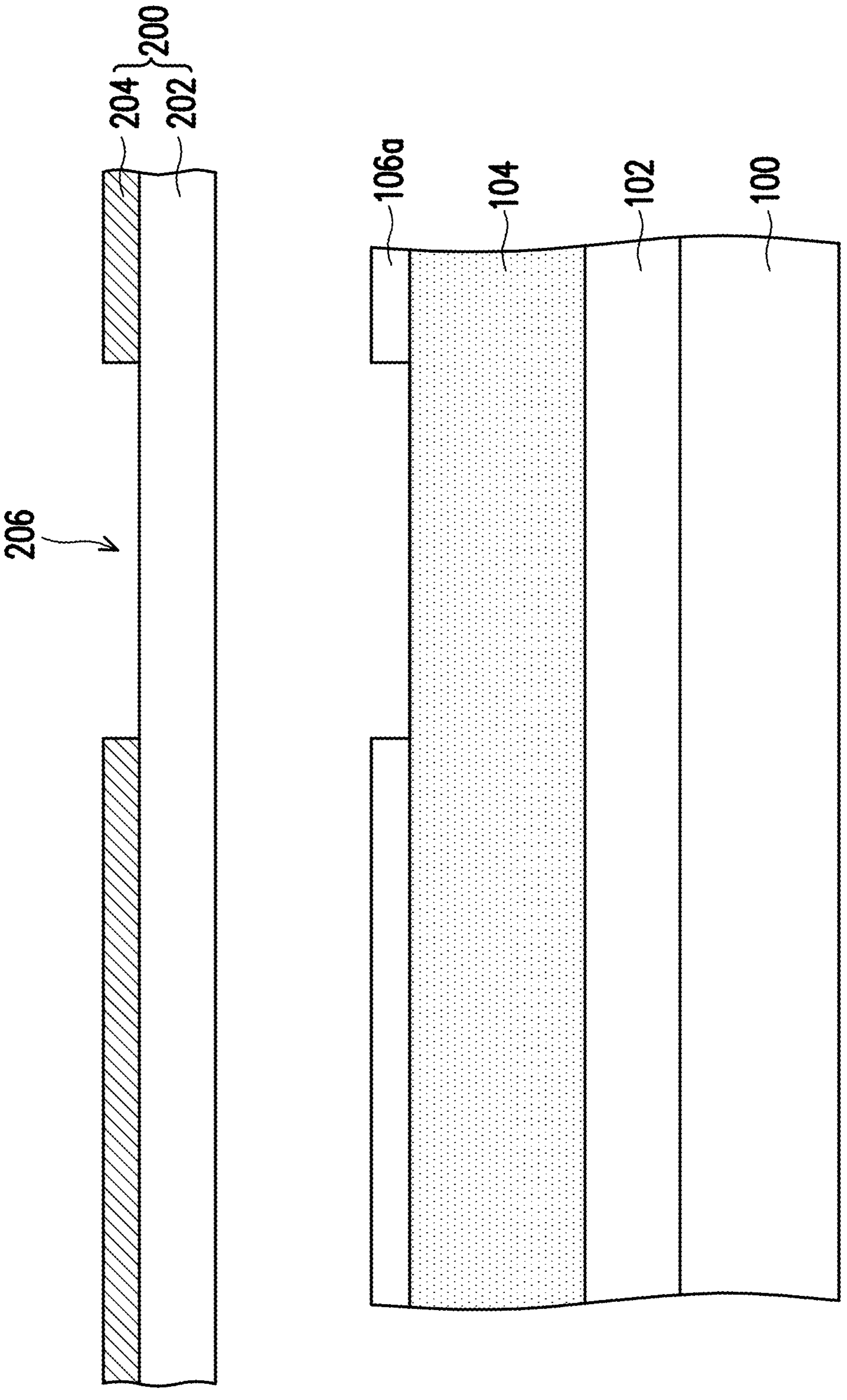
Figure 2:
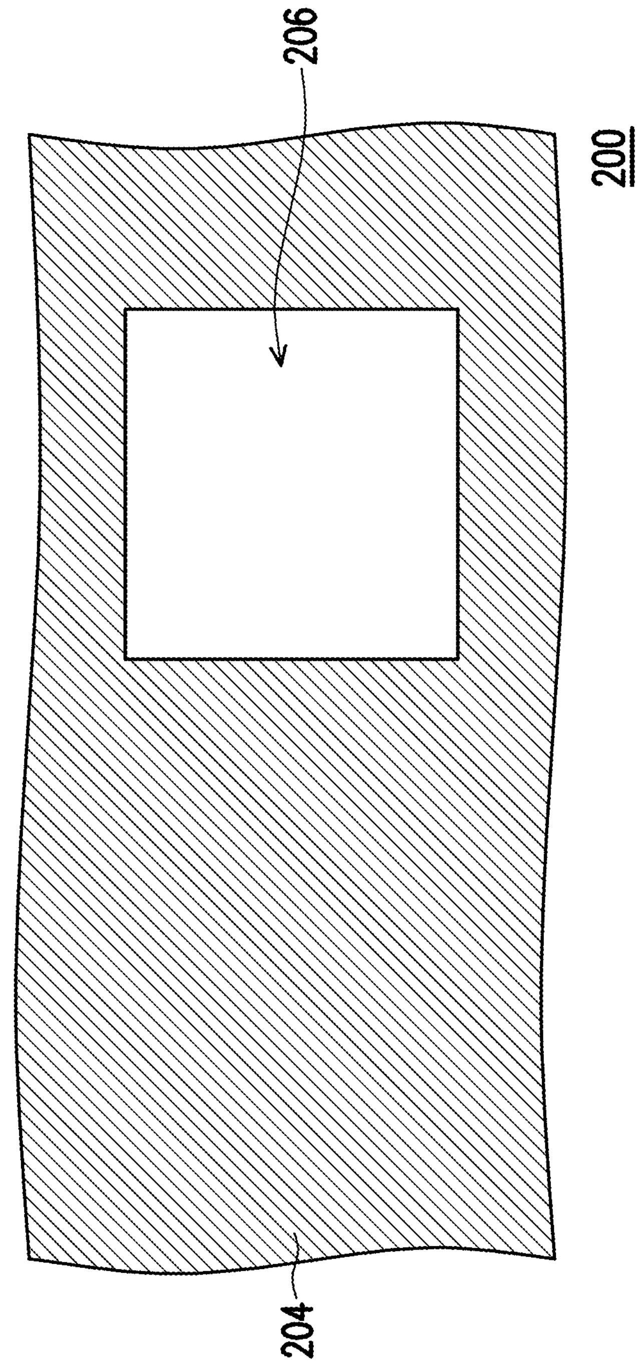
FIG. 2 is a schematic top view of the first photomask used in the embodiment.

Referring to FIG. 1B, a first exposure and development process is performed on the first photoresist layer 106. In detail, a first photomask 200 is provided, as shown in FIGS. 1B and 2. The first photomask 200 may include a transparent substrate 202 and a light shielding layer 204 formed on the transparent substrate 202, wherein an opening 206 is formed in the light shielding layer 204 to expose the transparent substrate 202. Then, the first exposure and development process is performed on the first photoresist layer 106 using the first photomask 200 to form a patterned photoresist layer 106*a*. The patterned photoresist layer 106*a* exposes a part of the hardmask layer 104.

Figure 1C:
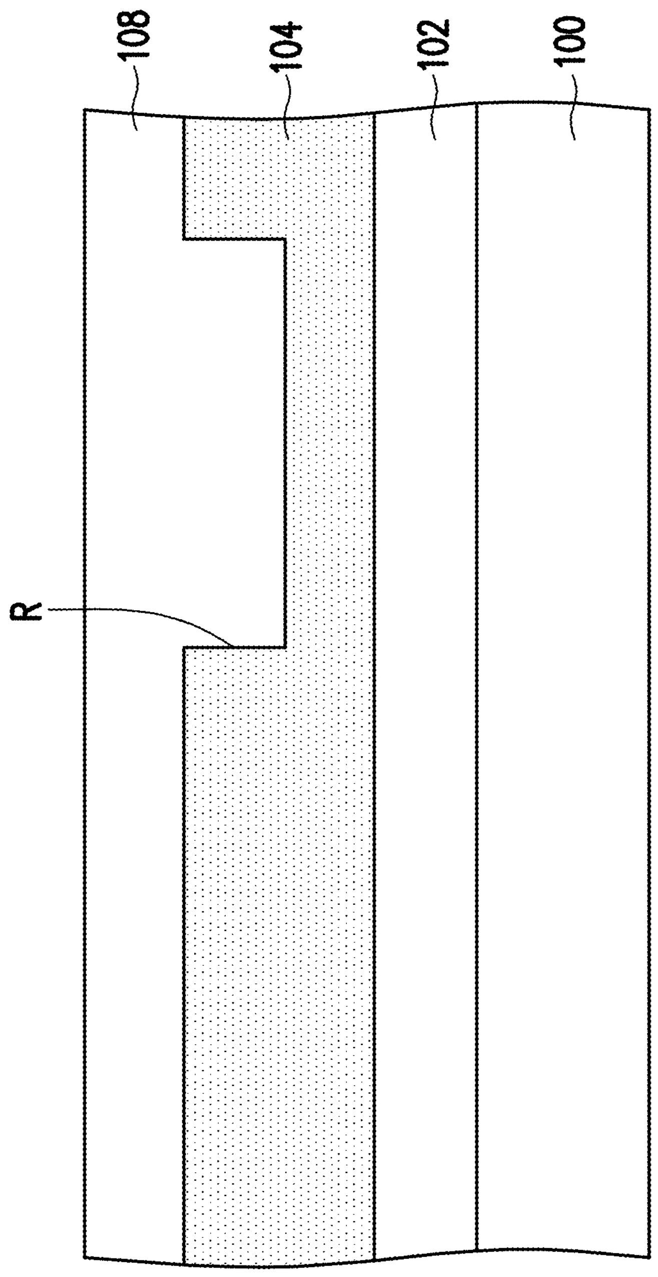

Referring to FIG. 1C, an anisotropic etching process is performed on the hardmask layer 104 using the patterned photoresist layer 106*a* as an etching mask to remove a part of the hardmask layer 104 to form a recess R. In the present embodiment, the bottom of the recess R is located in the hardmask layer 104. That is, the recess R does not penetrate through the hardmask layer 104. The recess R is formed to reduce the thickness of the hardmask layer 104. In the present embodiment, the position of the recess R corresponds to a region where the plurality of target patterns with a larger pattern density to be formed in the target layer 102.

In the present embodiment, the first photomask 200 is used to form the recess R in the hardmask layer 104. Since the recess R has a larger area and a smaller pattern density, a light with a wavelength of 365 nm (i-line) or 248 nm (KrF) may be used for exposing the first photoresist layer 106, and the thickness of the first photoresist layer 106 may be 50 nm to 200 nm, but the prevent invention is not limited thereto. Therefore, the cost of the manufacturing method of the present embodiment may be reduced.

After the recess R is formed, the patterned photoresist layer 106*a* is removed. Then, a second photoresist layer 108 is formed on the hardmask layer 106, and fills the recess R. In the present embodiment, since the second photoresist layer 108 is used to define the plurality of first target patterns with a smaller pattern density and the plurality of second target patterns with a larger pattern density to be formed in the target layer 102, a wavelength for exposing the second photoresist layer 108 is less than a wavelength for exposing the first photoresist layer 106. For example, a light with a wavelength of 13 nm (EUV) may be used for exposing the second photoresist layer 108 and the thickness of the second photoresist layer 108 may be 40 nm to 100 nm to form precise target patterns, but the prevent invention is not limited thereto.

Figure 1D:
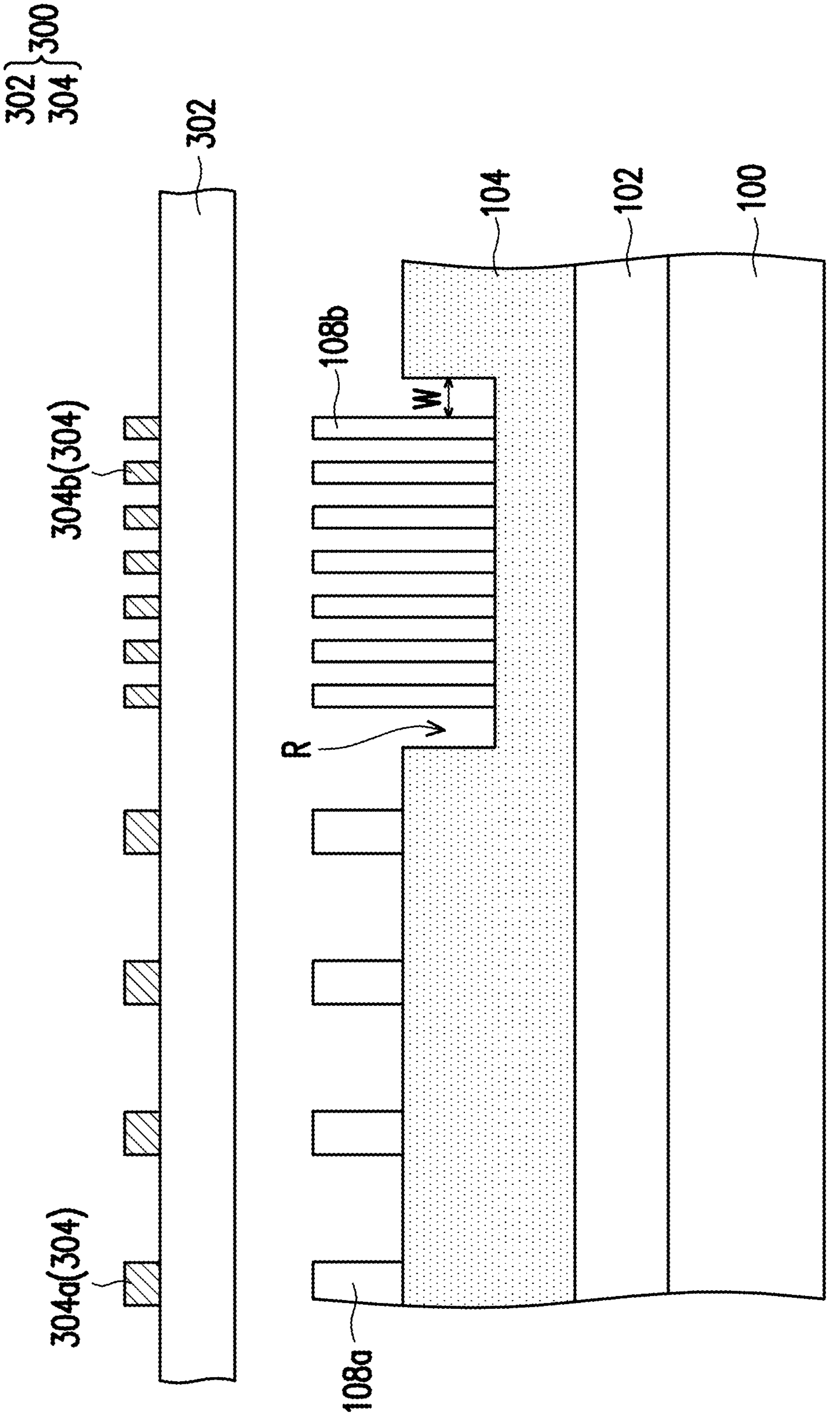
Figure 3:
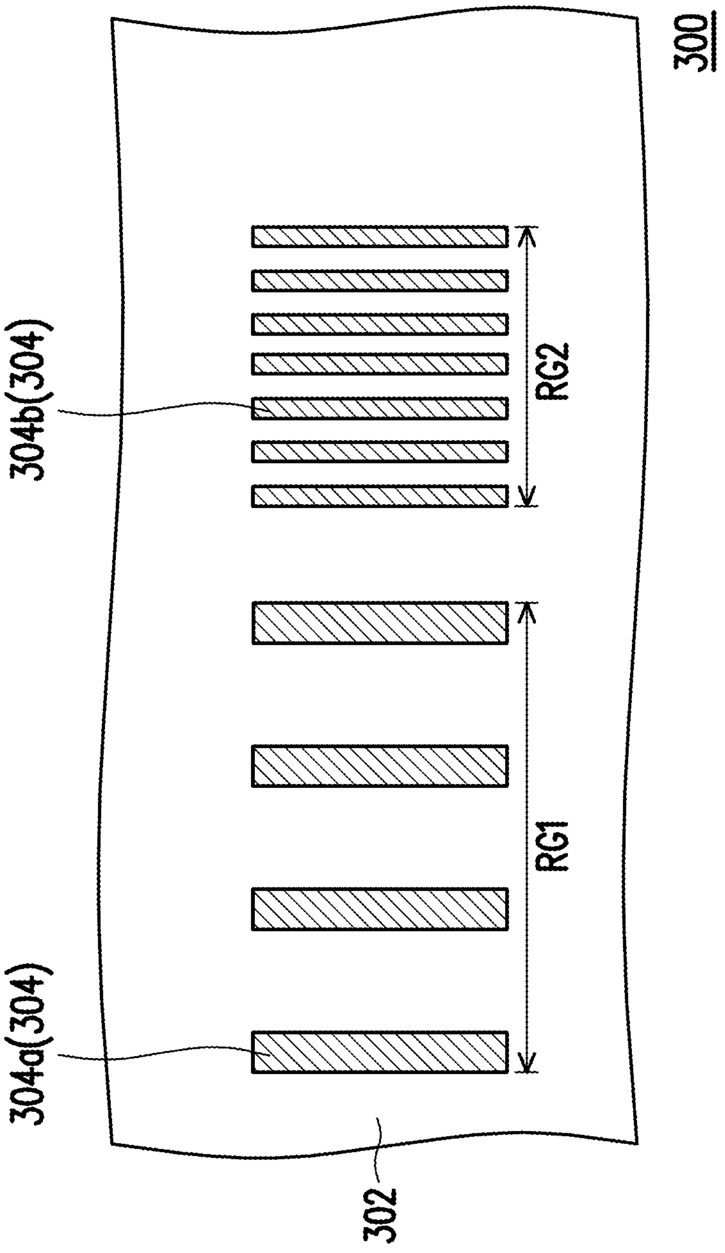
FIG. 3 is a schematic top view of the second photomask used in the embodiment.

Referring to FIG. 1D, a second exposure and development process is performed on the second photoresist layer 108. In detail, a second photomask 300 is provided, as shown in FIGS. 1D and 3. The second photomask 300 may include a transparent substrate 302 and a light shielding layer 304 formed on the transparent substrate 302, wherein the light shielding layer 304 is patterned to include a first region RG1 and a second region RG2, a plurality of first photomask patterns 304*a* with a smaller pattern density are located in the first region RG1, and a plurality of second photomask patterns 304*b* with a larger pattern density are located in the second region RG2. The plurality of first photomask patterns 304*a* corresponds to the first target patterns with a smaller pattern density to be formed in the target layer 102, and the plurality of second photomask patterns 304*b* corresponds to the second target patterns with a larger pattern density to be formed in the target layer 102. Then, the second exposure and development process is performed on the second photoresist layer 108 using the second photomask 300 to form a plurality of first photoresist patterns 108*a* on the top surface of the hardmask layer 104 and a plurality of second photoresist patterns 108*b* in the recess R simultaneously. In this way, a pattern density of the plurality of first photoresist patterns 108*a* is smaller than a pattern density of the plurality of second photoresist patterns 108*b*. That is, the second photoresist patterns 108*b* with a larger pattern density is located in the recess R, and the first photoresist patterns 108*a* with a smaller pattern density is located outside the recess R.

In the present embodiment, the width W between the boundary of the recess R and the outmost second photoresist pattern 108*b* of the plurality of second photoresist patterns 108*b* is 0.1 μm to 5 μm. In other words, for the first photomask 200 used to form the recess R and the second photomask 300 used to form the first photoresist patterns 108*a* and the second photoresist patterns 108*b*, when overlapping the first photomask 200 and the second photomask 300, from the top view, the opening 206 of the first photomask 200 exposes the second region RG2 of the second photomask 300, and the boundary of the opening 206 and the outmost second photomask pattern 304*b* of the plurality of second photomask patterns 304*b* is designed to be 0.1 μm to 5 μm. In this way, the formed second photoresist patterns 108*b* may have a uniform thickness and a precise profile.

Figure 1E:
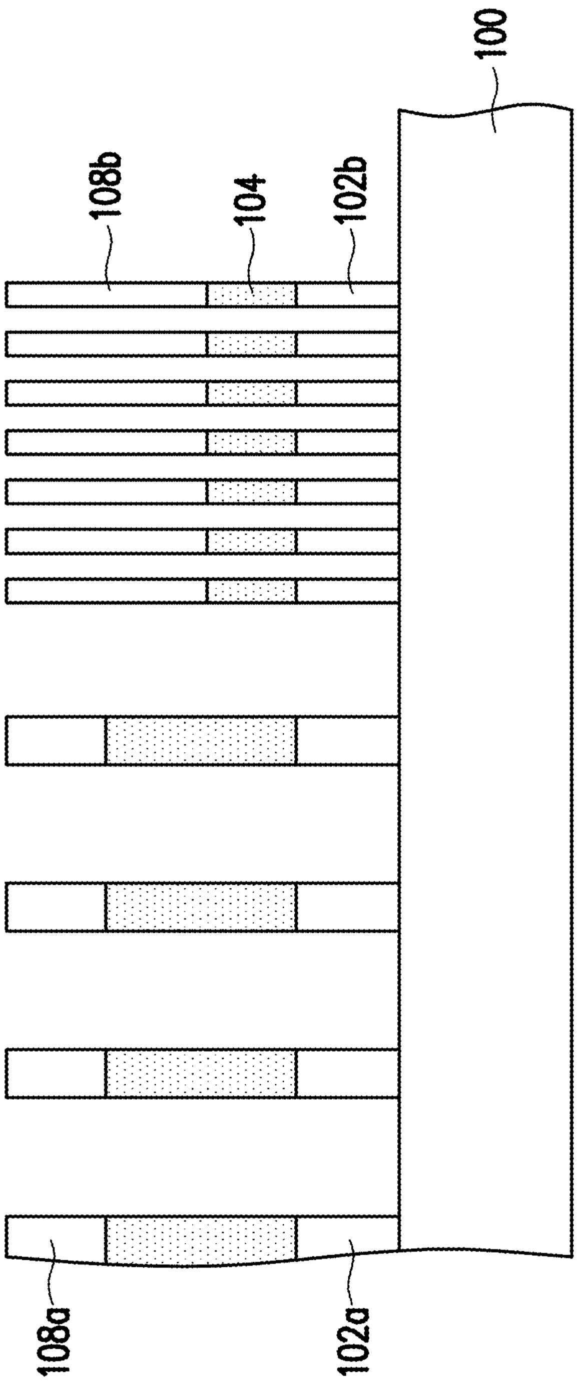

Referring to FIG. 1E, an anisotropic etching process is performed on the hardmask layer 104 and the target layer 102 using the first photoresist patterns 108*a* and the second photoresist patterns 108*b* as an etching mask. In this way, the hardmask layer 104 and the target layer 102 are patterned. In particular, the target layer 102 is patterned to include a plurality of first target patterns 102*a* corresponding to the first photoresist patterns 108*a* and a plurality of second target patterns 102*b* corresponding to the second photoresist patterns 108*b*.

In the present embodiment, during the anisotropic etching process described in FIG. 1E, since the recess R in the hardmask layer 104 is formed in advance corresponding to the region where the patterns with a larger pattern density are formed in the target layer 102, the thickness of the portion of the hardmask layer 104 corresponding to the region is thinner. In this way, even though the etching rate on the portion of the hardmask layer 104 on which the second photoresist patterns 108*b* with a larger pattern density are formed is slower, the hardmask layer 104 and the target layer 102 may be patterned without over-etching on the substrate 100 or under-etching on the target layer 102 after the anisotropic etching process.

Figure 1F:
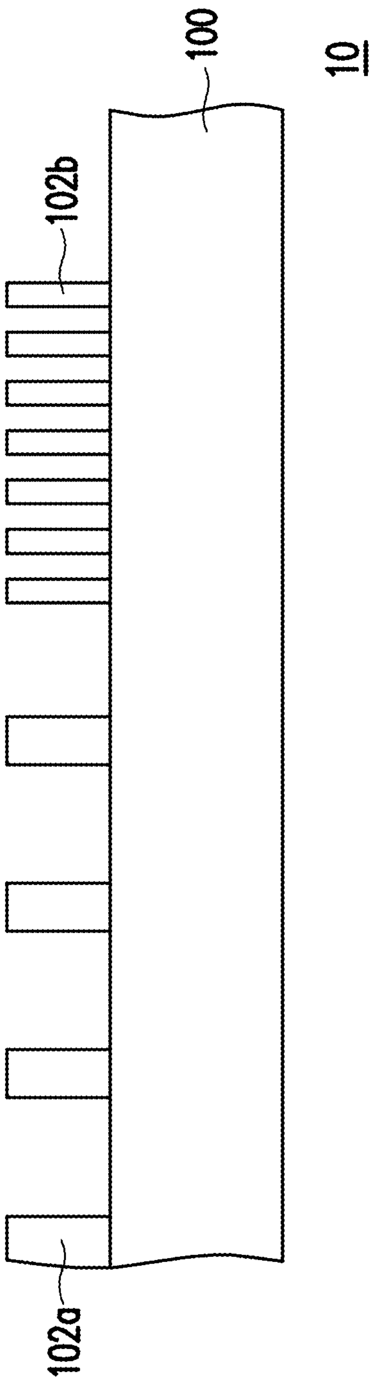

Referring to FIG. 1F, the first photoresist patterns 108*a*, the second photoresist patterns 108*b* and the hardmask layer 104 are removed. In this way, a semiconductor structure 10 of the present embodiment is formed.

In the semiconductor structure 10, the first target patterns 102*a* with a smaller pattern density and the second target patterns 102*b* with a larger pattern density are formed on the substrate, and the top surfaces of the first target patterns 102*a* and the top surfaces of the second target patterns 102*b* are coplanar. The substrate 100 is not damaged, and the first target patterns 102*a* and the second target patterns 102*b* are not collapsed or broken.

In the present embodiment, the first target patterns 102*a* and the second target patterns 102*b* are line patterns, but the present invention is not limited thereto. In other embodiments, the first target patterns 102*a* and the second target patterns 102*b* may be hole patterns in the target layer 102. In the embodiment in which the first target patterns 102*a* and the second target patterns 102*b* are hole patterns in the target layer 102, depending on the type of the second photoresist layer 108, the first photomask patterns 304*a* and the second photomask patterns 304*b* may be hole patterns, i.e. the holes formed in the light shielding layer 304.

In addition, in the present embodiment, the first photomask pattern 304*a* and the second photomask pattern 304*b* are the same type of patterns (line patterns), but the present invention is not limited thereto. In other embodiments, the first photomask pattern 304*a* and the second photomask pattern 304*b* may be different types of patterns (line patterns and hole patterns).

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor structure, comprising:
- forming a target layer on a substrate;
- forming a hardmask layer on the target layer;
- removing a part of the hardmask layer to form a recess in the hardmask layer;
- forming a plurality of first patterns on a top surface of the hardmask layer and a plurality of second patterns in the recess simultaneously, wherein a pattern density of the plurality of first patterns is smaller than a pattern density of the plurality of second patterns;
- patterning the hardmask layer and the target layer using the plurality of first patterns and the plurality of second patterns as a mask to form a plurality of first target patterns corresponding to the plurality of first patterns and a plurality of second target patterns corresponding to the plurality of second patterns in the target layer; and
- removing the plurality of first patterns, the plurality of second patterns and the hardmask layer.

2. The manufacturing method of claim 1, wherein a width between a boundary of the recess and an outmost second pattern of the plurality of second patterns is 0.1 μm to 5 μm.

3. The manufacturing method of claim 1, wherein a method for forming the recess comprises:
- providing a first photomask having an opening, wherein the opening corresponds to a position of the recess;
- forming a first photoresist layer on the hardmask layer;
- performing a first exposure and development process on the first photoresist layer using the first photomask to form a patterned photoresist layer;
- performing an anisotropic etching process on the hardmask layer using the patterned photoresist layer as an etching mask; and
- removing the patterned photoresist layer.

4. The manufacturing method of claim 3, wherein a thickness of the first photoresist layer is 50 nm to 200 nm.

5. The manufacturing method of claim 3, wherein the plurality of first patterns and the plurality of second patterns are photoresist patterns.

6. The manufacturing method of claim 5, wherein a method for forming the plurality of first patterns and the plurality of second patterns comprises:
- providing a second photomask comprising a first region and a second region, wherein a plurality of first photomask patterns corresponding to the plurality of first patterns are located in the first region, and a plurality of second photomask patterns corresponding to the plurality of second patterns are located in the second region;
- forming a second photoresist layer on the hardmask layer; and
- performing a second exposure and development process on the second photoresist layer using the second photomask.

7. The manufacturing method of claim 6, wherein a wavelength for exposing the first photoresist layer is greater than a wavelength for exposing the second photoresist layer.

8. The manufacturing method of claim 1, wherein the first pattern comprises a hole pattern or a line pattern.

9. The manufacturing method of claim 1, wherein the second pattern comprises a hole pattern or a line pattern.

10. The manufacturing method of claim 1, wherein a top surface of the first target pattern and a top surface of the second target pattern are coplanar.

* * * * *